(12) United States Patent
Brooks et al.

(10) Patent No.: US 6,229,155 B1
(45) Date of Patent: *May 8, 2001

(54) SEMICONDUCTOR AND METHOD OF FABRICATING

(75) Inventors: Daniel S. Brooks, Essex Junction; Phillip F. Chapman, Colchester; John E. Cronin, Milton; Richard E. Wistrom, Essex Junction, all of VT (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/087,612

(22) Filed: May 29, 1998

(51) Int. Cl.[7] ................................................. H01L 29/72
(52) U.S. Cl. .................. 257/50; 257/52; 257/61; 257/412; 257/546; 257/547; 257/630; 257/773
(58) Field of Search ..................... 257/412, 546, 257/547, 630, 773, 52, 50, 61, 538

(56) References Cited

U.S. PATENT DOCUMENTS

| | | | |
|---|---|---|---|
| 5,292,399 | 3/1994 | Lee et al. | 156/643 |
| 5,549,784 | 8/1996 | Carmody et al. | 156/643.1 |
| 5,589,002 | 12/1996 | Su | 118/723 E |
| 5,594,684 | 1/1997 | Hsue | 365/185.01 |
| 5,596,207 | 1/1997 | Krishnan et al. | 257/48 |
| 5,599,726 | 2/1997 | Pan | 437/41 |
| 5,600,168 | * 2/1997 | Lee | 257/412 |
| 5,618,742 | * 4/1997 | Shone et al. | 438/263 |
| 5,710,438 | * 1/1998 | Oda | 257/412 |
| 5,856,698 | * 1/1999 | Hu et al. | 257/412 |

FOREIGN PATENT DOCUMENTS

| | | | |
|---|---|---|---|
| 5-251694 | * 9/1993 | (JP) | 257/412 |
| 6-151834 | * 5/1994 | (JP) | 257/412 |

OTHER PUBLICATIONS

Gabriel, C.T., Measuring and Controlling Gate Oxide Damage from Plama Processing, *Semiconductor International*, Jul. 1997: 151–156.

Rossnagel, S.M., Glow Discharge Plasmas and Sources for Etching and Deposition, *Thin Film Processes II*, 1991: 12–77.

* cited by examiner

*Primary Examiner*—Edward Wojciechowicz
(74) *Attorney, Agent, or Firm*—Connolly, Bove, Lodge & Hutz LLP; Eugene I. Shkurko

(57) ABSTRACT

Provided is a semiconductor structure that comprises a substrate; a conductor; and insulating layer separating the conductor from the substrate; and a removable conductive strap coupled to the conductor and the substrate for maintaining a common voltage between the conductor and substrate during ion beam and/or plasma processing; and a method for fabricating.

17 Claims, 5 Drawing Sheets

SEMICONDUCTOR AND METHOD OF FABRICATING

TECHNICAL FIELD

The present invention is concerned with a semiconductor structure and method of fabricating. More particularly, the present invention is concerned with eliminating potential drop across a semiconductor wafer that typically occurs during processing. According to the present invention, a sacrificial or removable conductive strap is coupled to the semiconductor substrate and conductor where desired, for maintaining a common voltage between the conductor and substrate.

BACKGROUND OF INVENTION

In the manufacture of semiconductive devices, the steps of depositing layers and etching selected portions of layers which constitute the final chip in many cases employ ion beam and/or plasma processes. However, processes such as plasma deposition, plasma etching and ion implantation contribute to charging damage, leakage paths and/or gate oxide blow out. In particular, during plasma processes, the semiconductor wafer surface becomes negatively charged causing a potential drop across the wafer because the surface which the wafer rests on is at a different potential than the plasma potential. Typically, electrically floating surfaces within a plasma acquire a negative charge due to the higher mobility of electrons as compared to positively charged ions.

This potential drop can result in wafer charging, leakage paths, and breakdown of dielectric layers (see FIG. 1). This same problem occurs when employing ion beam techniques since such result in a positive charge on the wafer surface due to ion bombardment from the ion beam.

The problem due to the potential drop across the wafer is particularly pronounced when dealing with relatively thin dielectric layers such as about 40 to about 50 angstroms which are especially sensitive to being damaged. For instance, see Gabriel, "Measuring and Controlling Gate Oxide Damage from Plasma Processing", *Semiconductor International*, July 1997, pp. 151–156. In fact, in view of the significance of this problem of gate oxide damage, in 1996 the American Vacuum Society, the IEEE/Electron Devices Society and the Japan Society of Applied Physics sponsored the first International Symposium on Plasma Process-Induced Damage.

It would therefore be desirable to provide a method to compensate for or eliminate this potential drop across the wafer or at least to minimize the possible detrimental effect attributed to this problem.

SUMMARY OF INVENTION

The object of the present invention is to at least minimize and if not, entirely eliminate, the potential drop across the semiconductor wafer and especially across a gate oxide during plasma and ion beam processing. Another object of the present invention is to minimize any harmful effects caused by potential drop across the wafer during processing.

The present invention provides a sacrificial structure and fabrication method which ensures that the potential drop across any gate oxide is at least reduced, if not entirely eliminated, during plasma and ion beam processing. The present invention provides a removable or sacrificial conductive strap or spacer, which provides a conductive path around insulating layer such as the gate oxide to thereby eliminate any damage to the insulating layer.

More particularly, the present invention is concerned with a semiconductor structure that comprises a semiconductor substrate; a conductor; and a first insulating layer separating the conductor and the substrate. A removable conductive strap is coupled to the conductor and the substrate in order to maintain a common voltage between the conductor and substrate during ion beam and/or plasma processing of the semiconductor structure. The removable conductive strap is electrically decouplable from between the conductor and the substrate upon completion of the ion beam and/or plasma processing. The present invention is also concerned with the semiconductor structure obtained upon electrically decoupling the conductive strap by thermal oxidation.

The present invention is also concerned with a process for fabricating a semiconductor structure which comprises providing a semiconductor substrate; providing a conductor on the substrate; and providing a first insulating layer separating the substrate and the conductor. A removable conductive strap is coupled to the conductor and substrate for maintaining a common voltage between the conductor and substrate during ion beam and/or plasma processing of the semiconductor structure. After fabricating, the conductive strap is decoupled from the conductor and substrate.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

Figure 1:
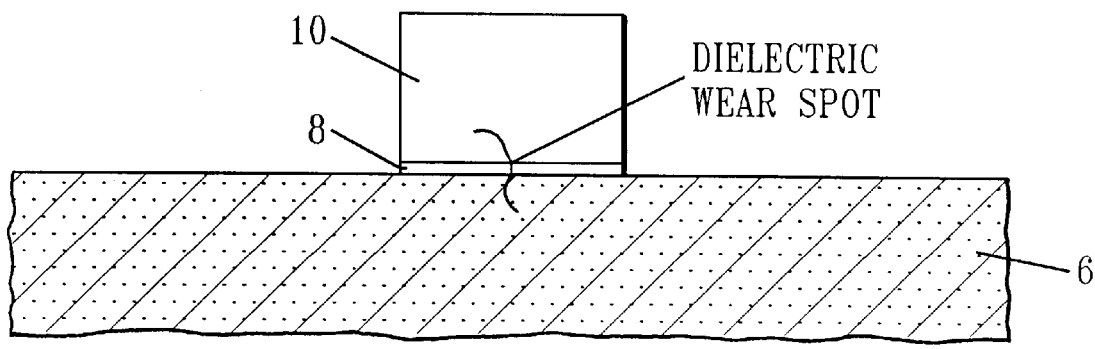
FIG. 1 is a schematic diagram of a typical prior art semiconductor structure.

The present invention provides a sacrificial structure and fabrication method for ensuring that the potential drop across an insulating layer such as a gate oxide is reduced during damaging plasma and/or ion beam processing. For instance, FIG. 1 illustrates typical prior art structure comprising a semiconductor substrate 6 with a gate oxide 8 thereon and a gate conductor 10 located above gate oxide 8. When subjected to ion beam or plasma processing, a potential drop will exist between the gate conductor 10 and the exposed surface of semiconductor substrate 6. As discussed above, this potential drop can result in wafer charging, leakage paths, and especially dielectric breakdown of the gate oxide, particularly in structures wherein such is relatively thin.

Figure 2:
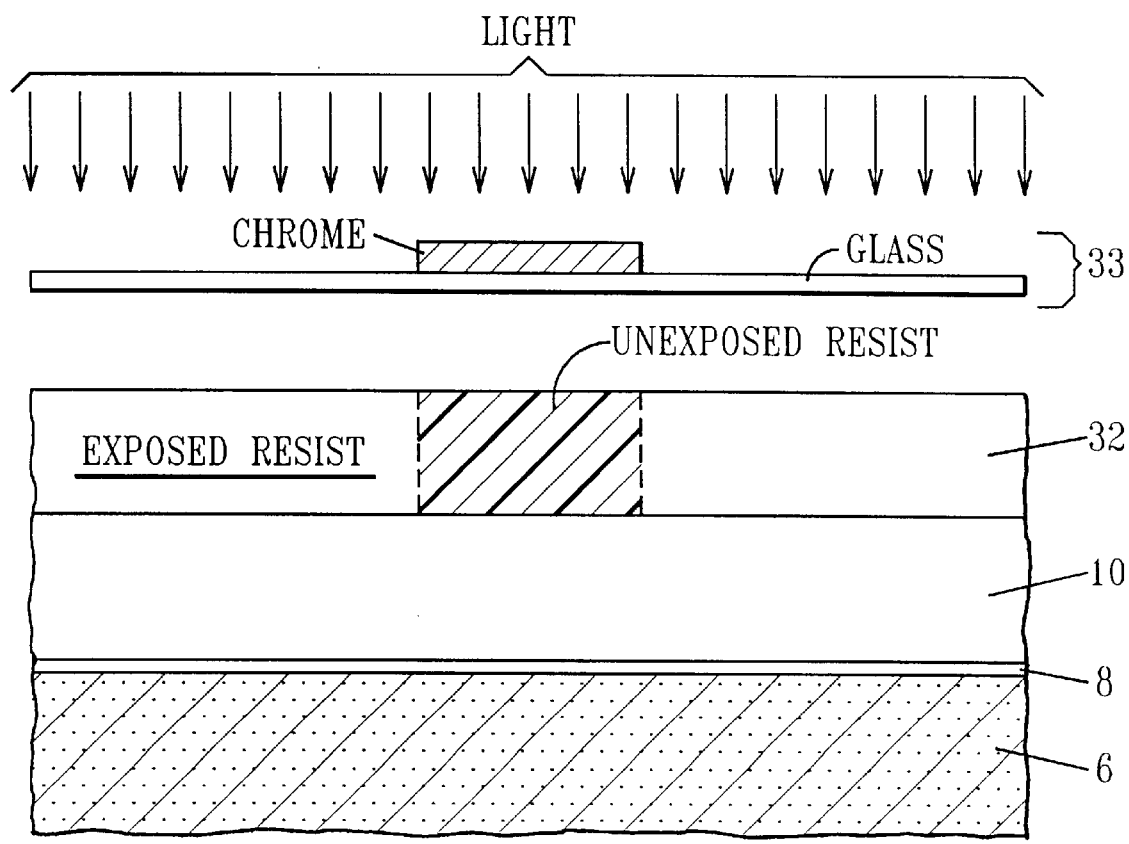
FIGS. 2–9 are schematic diagrams of a semiconductor structure in accordance with the present invention at different stages of the processing.
Figure 3:
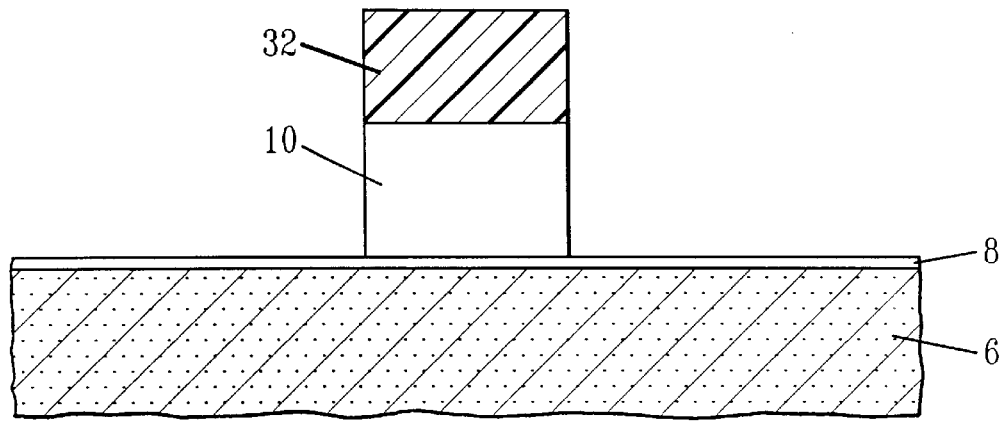
Figure 4:
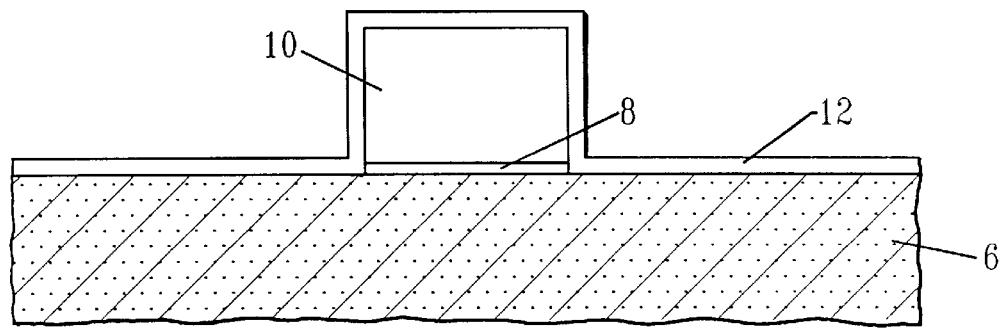

Reference to FIGS. 2–10 illustrates various means for overcoming this problem. For instance, FIG. 2 illustrates a semiconductor substrate 6 such as a silicon substrate. A thin gate insulator 8 is grown on or deposited onto the silicon substrate 6. This gate insulator is typically about 40 to about 100 Å thick and can be formed by thermal oxidation of the silicon substrate at about 800–900° C. in the presence of oxygen, or any other conventional technique. A layer of a conductor such as a layer of polycrystalline silicon 10 can be deposited and preferably conformally deposited on the gate insulator oxide. The polysilicon layer is typically about 1500 to about 5000 Å thick, and may be formed for instance by chemical-vapor deposition. In addition, the polycrystalline silicon layer is doped with an n-type or p-type dopant by one of several conventional techniques such as during polycrystalline silicon deposition or by ion implantation following polycrystalline silicon deposition. The ion implantation doping does not damage the gate insulator at this stage because of protection provided by the relatively large surface area of the polysilicon prior to defining the gate. The gate oxide and gate conductor can then be defined by conventional photolithographic techniques.

For instance, a photoresist 32 is applied such as by spinning or by spraying, typically providing a film thickness of about 1 micron. Any of the well known photosensitive resist materials known in the art can be employed. The photoresist employed can be a positive photoresist or a negative photoresist. A positive photoresist material is one which on exposure to imaging radiation, is capable of being rendered soluble in a solvent in which the unexposed resist is not soluble. A negative resist material is one which is capable of polymerizing and/or insolublizing upon exposure to imaging radiation.

The photoresist is patterned employing mask 33 such as a chrome/glass mark. Those portions of the mask where the chrome exists do not permit passage of the light for development; whereas, the clear glass portions of the mask permit passage of the developing light such as UV light to thereby expose the underlying photoresist 32.

After the photoresist 32 is developed by dissolving the exposed portions of the resist in a suitable solvent, the gate can be defined (see FIG. 3) by reactive ion etching such as using a fluorocarbon or chlorocarbon gas. The etching will stop on the thermal oxide layer because it only removes the oxide at a rate compared to that for the silicon of less than about 1:100. Also, the oxide to remain as the gate insulator will not be etched at this stage of the process.

The remaining resist 32 is removed such as by dissolving in a suitable solvent, or in an $O_2$ plasma etch. Next, the gate insulation is defined using the gate as the defining mask. The thermal oxide can be removed by plasma etching with fluorocarbon chemistry or by wet etching with aqueous fluoride solutions which stops on the silicon substrate because the etching merely removes silicon at a rate compared to that for the oxide of less than about 1:100.

A sacrificial conductive strap 12 is then conformally provided on the silicon substrate 6 connecting to polysilicon conductor gate 10 along sidewalls of the gate oxide 8 and sidewalls of the gate conductor. The sacrificial conductive strap is typically about 50 to about 400 Å thick and is a thermally oxidizable material (see FIG. 4). A preferred material is amorphous or polycrystalline silicon. The silicon 10 can be formed by chemical-vapor deposition at about 550 to 700° C. over the gate oxide 8 and conductor gate 10 and can be doped with an n-type or p-type dopant. There are many known techniques in the art for amorphous silicon and polycrystalline silicon deposition, and therefore such need not be described herein.

Figure 5:
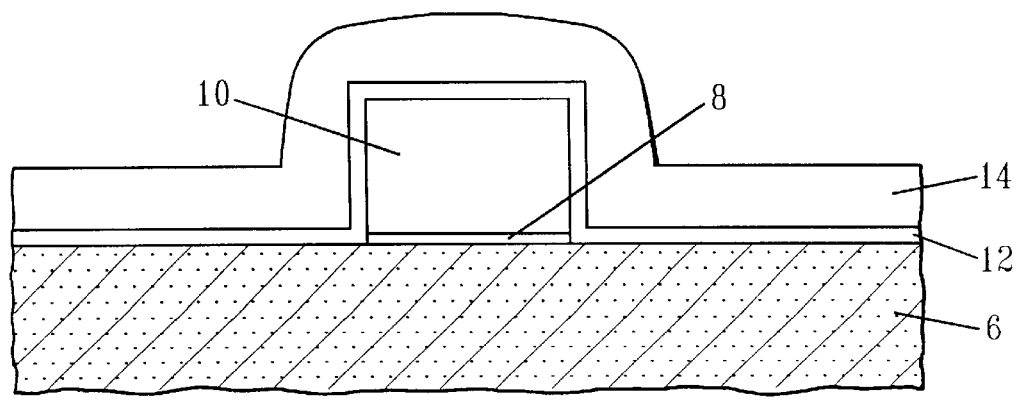
Figure 6:
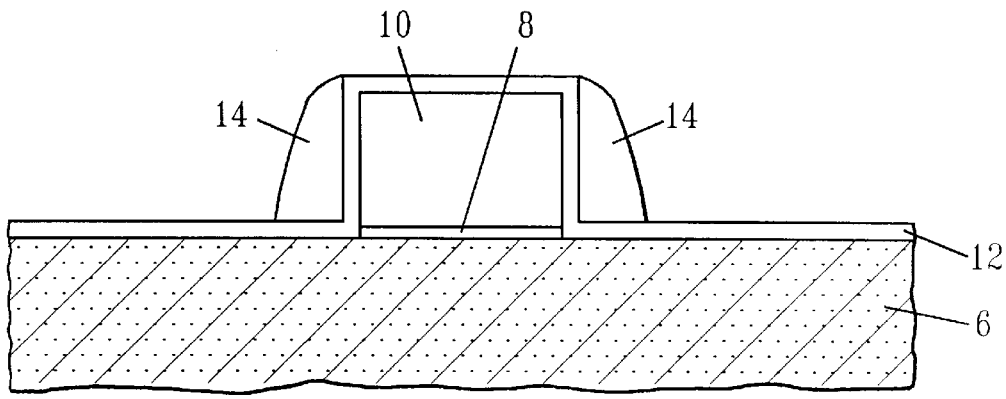

Next usual sidewall insulator 14 is conformally provided to electrically isolate the conductive gate 10 from other structures of the completed semiconductor structure (see FIG. 5). Typically, spacer 14 can be silicon dioxide and can be provided by several known procedures including vacuum or chemical-vapor deposition techniques. After the deposition, the oxide can be subjected to reactive ion etching to remove oxide except for the sidewalls as shown in FIG. 6. The reactive ion etching can employ a gaseous mixture containing a fluorocarbon and a second gas capable of supplying hydrogen as disclosed in U.S. Pat. No. 4,283,249 to Ephrath and, as discussed above, stops on the polysilicon substrate (see FIG. 6).

The conductive spacer 12 provides a conductive path around gate oxide 8 from the gate conductor 10 to substrate 6 thereby conducting the gate oxide 8 during plasma and/or ion beam processing. The structure can be subjected to an ozone plasma strip for removing unwanted "polymer" residue formed due to the etching to define the spacer 14.

Figure 7:
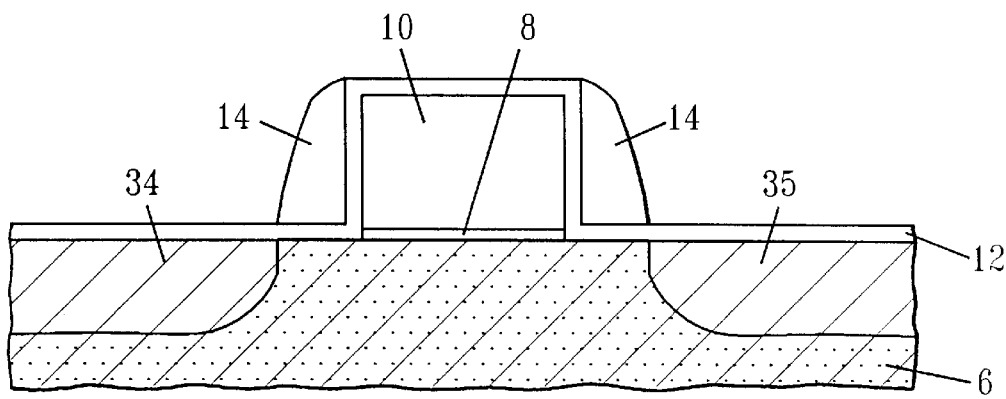

Next, the structure is subjected to typical processing including plasma processing and/or ion beam processing such as ion implantation for providing active regions such as source 34 and drain 35 regions and other insulation, deposition and etching procedures, depending upon the desired structure of the final product (see FIG. 7). After the desired plasma and/or ion beam processing has been carried out, the removable conductive strap 12 is decoupled from the gate conductor 10 and substrate 6 such as by converting the conductor 12 to an insulator. This can be achieved by thermal oxidation of the conductive spacer 12 in an oxygen atmosphere typically at temperatures of about 700 to about 1000° C. using processes that are well known in the art. Oxidation of the conductive strap 12 will also result in some oxidation of a portion of the gate conductor, which if necessary can be subsequently removed.

Figure 8:
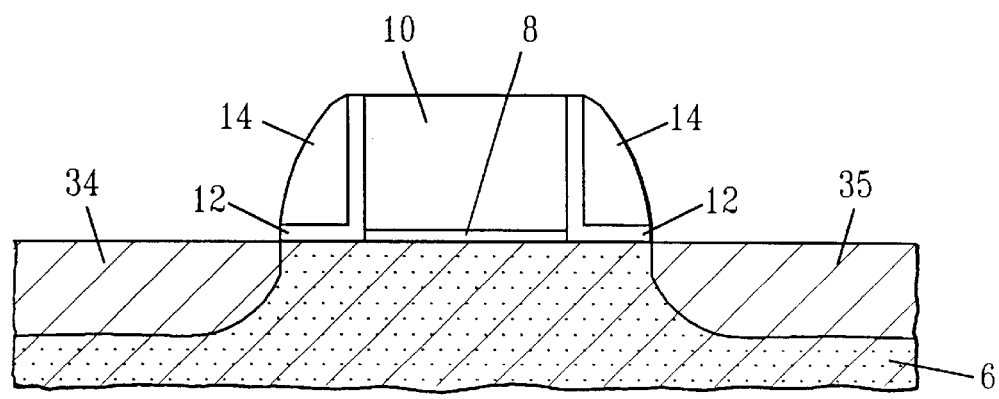
Figure 9:
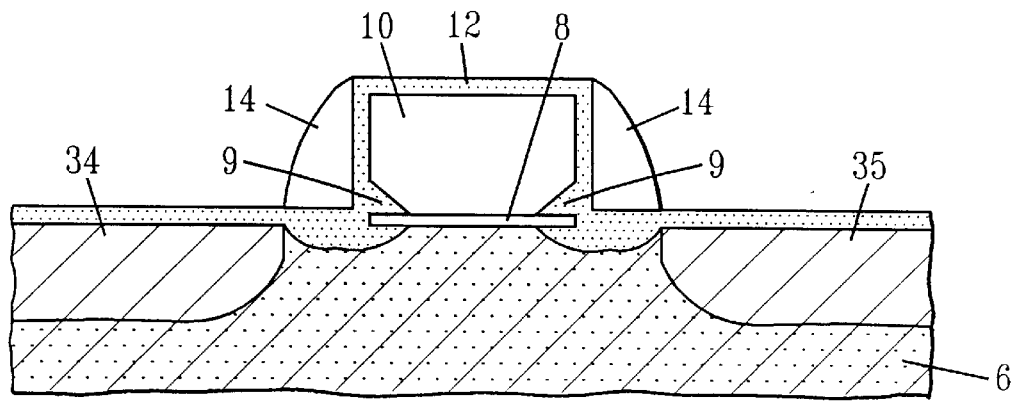
Figure 10:
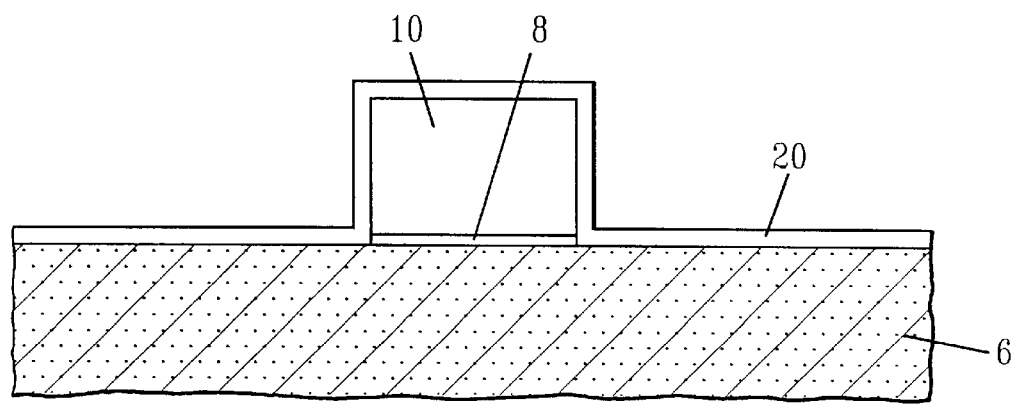
FIGS. 10–14 are schematic diagrams of alternative structures according to the present invention.
Figure 11:
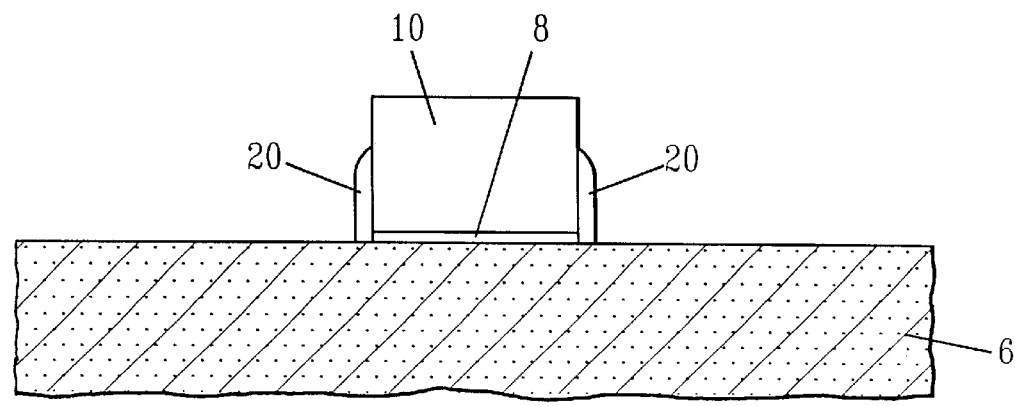
Figure 12:
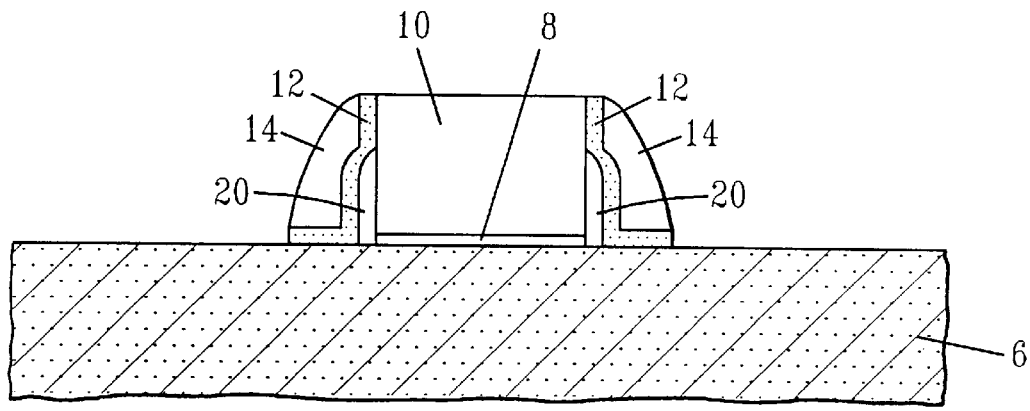

FIG. 9 illustrates the structure after oxidation of the conductive spacer 12 has been carried out. Those portions of the thin layer remaining on the substrate can be removed by plasma etching with fluorocarbon chemistry or by wet etching with aqueous fluoride solutions, resulting in a structure as illustrated in FIG. 8, where the conductive spacer 12 is now an insulator. The structure can then proceed to the remaining processing such as siliciding, metallization and the like. Moreover, in some instances the step of oxidizing the conductive space 12 may cause what is referred to as bird's beak 9 that forms at the gate oxide 8, gate conductor 10, and thin conductive spacer 12 corners. In order to eliminate the possibility of this type of structure from occurring, an alternative embodiment of the present invention is illustrated in FIG. 12. In particular, in FIG. 10 a second insulator 20 such as a thin silicon nitride ($Si_3N_4$) spacer is conformally formed adjacent the sidewalls of the insulator 8 and gate conductor 10 prior to formation of the thin conductive spacer 12. The silicon nitride layer is typically about 50 to about 300 Å thick. The silicon nitride layer 20 can be deposited by conventional chemical-vapor deposition techniques and defined by plasma etching using fluorocarbon chemistry, which is well known in the art (see FIG. 11). Typically, its height is about 50% to about 90% of the height of the gate. The silicon nitride spacer 20 blocks the corner gate oxide 9 oxidation that is shown occurring in FIG. 9. Since the silicon nitride 20 is an insulator, it can remain in place during the subsequent processing. As carried out in the embodiments shown in FIGS. 5–8, after the plasma and/or ion beam processing, the thin conductive spacer 12 is converted to an insulator by thermal processing (see FIG. 12).

Figure 13:
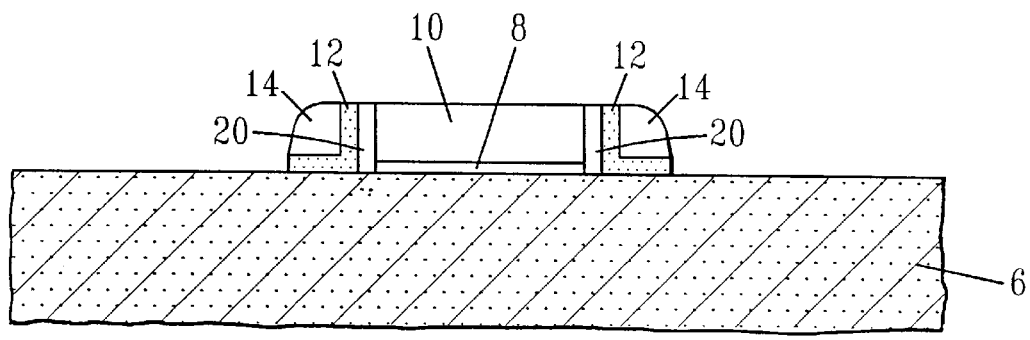

FIG. 13 illustrates an alternative method for decoupling the thin conductive spacer 12 from the substrate to the gate conductor 10. In particular, instead of thermal processing, the top of the gate conductor 10, nitride spacer 20, conductive spacer 12, and sidewall spacer 14 are planarized using conventional chemical-mechanical polishing techniques such as polishing with a silica hydroxide based slurry until the conductive path is eliminated as illustrated in FIG. 13. Accordingly, after the polishing, the conductive path from the gate conductor 10 to the conductive spacer 12 and then in turn to substrate 6 no longer exists.

Figure 14:
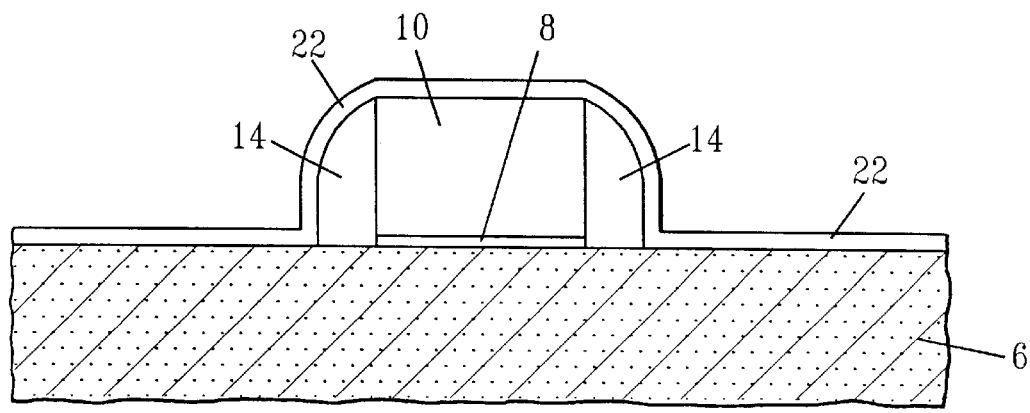

In a still further embodiment according to the present invention, FIG. 14 illustrates providing a removable conductive layer 22 being deposited over the gate conductor 10, sidewall spacer 14 structure to form a conductive path from the gate conductor 10 to the thin conductor 22 and then in turn to substrate 6. The thin conductor is typically about 50 to about 400 Å thick. After processing, it can be thermally oxidized or removed by polishing.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. Semiconductor structure comprising a semiconductor substrate; a conductor; a first insulating layer separating said conductor and said substrate; and a removable conductive strap coupled to said conductor and said substrate for maintaining a common voltage between said conductor and said substrate during ion beam processing or plasma processing or both of said semiconductor structure wherein said conductive strap is electrically decouplable from between said conductor and said substrate upon completing the ion beam processing or plasma processing or both, and wherein said conductive strap is amorphous or polycrystalline silicon.

2. The semiconductor structure of claim 1 wherein said removable conductive strap is about 50 to about 400 Å thick.

3. The semiconductor structure of claim 1 wherein said first insulating layer is a gate oxide and said conductor is a gate conductor wherein the gate oxide and gate conductor have coplanar sidewalls; and wherein said removable conductive strap is located at least partially along a sidewall of said gate conductor.

4. The semiconductor structure of claim 3 wherein said removable conductive strap is located on the sidewalls of said gate oxide.

5. The semiconductor structure of claim 1 wherein said conductive strap is a thermally oxidizable conductive material.

6. The semiconductor structure of claim 1 wherein said conductive strap is a layer formed at least partially along a top surface of said conductor.

7. The semiconductor structure of claim 1 wherein said conductor is a gate conductor, said first insulating layer is gate oxide and wherein said gate conductor and said gate oxide have coplanar sidewalls.

8. The semiconductor structure of claim 7 further comprising a second insulator disposed proximately to a point where the conductor meets the insulator for separating the conductive strap from that point.

9. The semiconductor structure of claim 7 which further includes a second insulator spacer located on the gate oxide sidewall and on a portion of the gate conductor sidewall adjacent the gate oxide sidewall; and wherein said conductive strap is located on said second insulator spacer and on a portion of the gate conductor sidewall; and wherein said conductive strap contacts said semiconductor substrate.

10. The semiconductor structure of claim 9 wherein said second insulator is silicon nitride.

11. The semiconductor structure of claim 7 which further includes sidewall insulating spacer on the coplanar sidewalls of said gate oxide and said gate conductor and wherein said conductive strap is formed over the semiconductor substrate and over said gate conductor.

12. The semiconductor of claim 1 wherein said conductive strap is decouplable by thermal oxidation after the processing is complete.

13. The semiconductor of claim 6 wherein the conductive strap is decouplable by thermal oxidation after the processing is complete.

14. The semiconductor of claim 6 wherein the conductive strap is decouplable by planarizing at least the conductive strap and the conductor after the processing is complete.

15. The semiconductor structure of claim 1 wherein said thermally oxidized layer is thermally oxidized amorphous or polycrystalline silicon.

16. The semiconductor structure of claim 1 wherein the conductive strap is amorphous silicon.

17. The semiconductor structure of claim 1 wherein the conductive strap is polycrystalline silicon.

* * * * *